(12) United States Patent
Kim et al.

(10) Patent No.: US 8,552,634 B2
(45) Date of Patent: Oct. 8, 2013

(54) ORGANIC LIGHT-EMITTING DISPLAY APPARATUS

(75) Inventors: So-Yeon Kim, Yongin (KR); Sung-Wook Han, Yongin (KR); Dong-Won Han, Yongin (KR); Jin-Ho Kwack, Yongin (KR); Hyo-Jin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 12/684,560

(22) Filed: Jan. 8, 2010

(65) Prior Publication Data

US 2010/0181903 A1 Jul. 22, 2010

(30) Foreign Application Priority Data

Jan. 20, 2009 (KR) .................. 10-2009-0004572

(51) Int. Cl.
*H01J 1/62* (2006.01)

(52) U.S. Cl.
USPC .......................... 313/504; 313/512

(58) Field of Classification Search
USPC ................................. 313/502–506
See application file for complete search history.

(56) References Cited

U.S. PATENT DOCUMENTS

| | | | |
|---|---|---|---|
| 2005/0146267 A1* | 7/2005 | Lee et al. ................. | 313/506 |
| 2005/0239294 A1 | 10/2005 | Rosenblum et al. | |
| 2006/0071233 A1* | 4/2006 | Cho et al. ................. | 257/103 |
| 2007/0182314 A1* | 8/2007 | Oh et al. .................. | 313/500 |
| 2008/0018230 A1 | 1/2008 | Yamada et al. | |
| 2008/0111125 A1* | 5/2008 | Kim et al. ................. | 257/40 |
| 2008/0203908 A1 | 8/2008 | Hasegawa et al. | |
| 2008/0238301 A1 | 10/2008 | Shim et al. | |
| 2008/0296600 A1 | 12/2008 | Kwack et al. | |

FOREIGN PATENT DOCUMENTS

| | | |
|---|---|---|
| JP | 2006-004650 | 1/2006 |
| JP | 2006-278021 A | 10/2006 |
| JP | 2008-210665 | 9/2008 |
| KR | 10-2007-0024547 | 3/2007 |
| KR | 10-2008-0003911 A | 1/2008 |
| KR | 10-2008-0105308 A | 12/2008 |

OTHER PUBLICATIONS

KIPO Registration Determination Certificate dated Nov. 30, 2010 issued in priority Korean application No. 10-2009-004572, 5 pages.
European Search Report dated Apr. 21, 2010, for corresponding European Patent application 10150999.0.

(Continued)

*Primary Examiner* — Anh Mai
*Assistant Examiner* — Brenitra M Lee
(74) *Attorney, Agent, or Firm* — Christie, Parker & Hale, LLP

(57) ABSTRACT

An organic light-emitting display apparatus for encapsulating an organic light-emitting device and/or improving its electrical properties. The organic light-emitting display apparatus includes: a substrate; a display portion on the substrate and including an organic light-emitting device; a non-display portion on both the substrate and the peripheral region of the display portion; and an encapsulation portion on the display portion and including a first encapsulation layer formed of an inorganic material and a second encapsulation layer formed of an organic material that are alternately stacked on the display portion, wherein an end portion of the first encapsulation layer contacts the substrate.

17 Claims, 3 Drawing Sheets

(56) References Cited

OTHER PUBLICATIONS

KIPO Office action dated Jul. 29, 2010 in Korean priority application No. 10-2009-0004572.

Japanese Office action dated Jul. 12, 2011, for corresponding Japanese Patent application 2010-009315, 4 pages.

European Summons to Attend Oral Hearings dated Jan. 19, 2012, for corresponding European Patent application 10150999.0, 7 pages.

Paschotta, R., *RP Photonics*, Encyclopedia of Laser Physics and Technology, article retrieved from the Internet on Jun. 1, 2012, http//www.rp-photonics.com/bragg_mirrors.html, XP 007920050, 5 pages.

JPO Office action dated Jul. 9, 2013, for corresponding Japanese Patent application 2012-174714, (2 pages).

* cited by examiner

ORGANIC LIGHT-EMITTING DISPLAY APPARATUS

CROSS-REFERENCE TO RELATED PATENT APPLICATION

This application claims priority to and the benefit of Korean Patent Application No. 10-2009-0004572, filed on Jan. 20, 2009, in the Korean Intellectual Property Office, the entire content of which is incorporated herein by reference.

BACKGROUND OF THE INVENTION

1. Field of the Invention

The present invention relates to an organic light-emitting display apparatus, and, more particularly, to an organic light-emitting display apparatus for encapsulating an organic light-emitting device.

2. Description of the Related Art

Organic and inorganic light-emitting display apparatuses are flat panel display apparatuses. In addition, organic and inorganic light-emitting display apparatuses are self-emitting display apparatuses that have wide viewing angle, good contrast, and rapid response speed. In addition, organic light-emitting display apparatuses including a light-emitting layer formed of an organic material have better brightness, lower driving voltage, and higher response speed characteristics than inorganic light-emitting display apparatuses, and can provide multicolored images. However, organic light-emitting display apparatuses can easily deteriorate due to contamination from outside air and penetration of moisture. In order to protect the organic light-emitting devices (e.g., the organic light-emitting diodes) of the organic light-emitting display apparatuses from the deterioration caused by the contamination of outside air and/or penetration of moisture, a thin film encapsulation method of alternately stacking organic layers and inorganic layers has been developed. The thin film encapsulation method can be used on an organic light-emitting display apparatus having a large, flexible, bendable, and/or ultra-thin film display.

With reference to a region horizontal to an upper portion of an organic light-emitting device (e.g., an organic light-emitting diode) included in an encapsulation layer region of an alternately stacked structure, impurities, air, or moisture may easily penetrate into the peripheral region of the organic light-emitting device.

Also, during a process of depositing organic layers, an organic light-emitting device is exposed to ultraviolet (UV) rays when liquefied or gasified organic monomer is cured by irradiating UV to form polymer, which deteriorates the properties of the organic layers included in the organic light-emitting device, and changes the interface properties between the organic layers and electrodes included in the organic light-emitting device. Thus, the electrical properties of the organic light-emitting device may be deteriorated and/or a leakage current may occur when a voltage is applied to the organic light-emitting device, thereby increasing power consumption of the organic light-emitting display apparatus that includes the organic light-emitting device and reducing the lifespan thereof.

SUMMARY OF THE INVENTION

An aspect of an embodiment of the present invention is directed toward an organic light-emitting display apparatus for protecting an organic light-emitting device (e.g., an organic light-emitting diode) from external impurities, such as gas and moisture, and/or improving the electrical properties of the organic light-emitting device.

According to an embodiment of the present invention, there is provided an organic light-emitting display apparatus including: a substrate; a display portion on the substrate and including an organic light-emitting device; a non-display portion being a peripheral region of the display portion on the substrate; and an encapsulation layer on the display portion and including at least a first encapsulation layer composed of an inorganic material and at least a second encapsulation layer composed of an organic material, the first and second encapsulation layers being alternately stacked on the display portion, wherein at least a portion of an end portion of the encapsulation layer which contacts the non-display portion of the substrate, includes only the first encapsulation layer.

An area of the second encapsulation layer may be greater than that of the display portion.

The thickness of the second encapsulation layer may be greater than that of the first encapsulation layer.

An area of the first encapsulation layer may be greater than that of the second encapsulation layer.

The first encapsulation layer may include a lowest layer of the encapsulation portion that is closest to the display portion.

The second encapsulation layer may include a lowest layer of the encapsulation portion that is closest to the display portion.

The organic light-emitting display apparatus may further include: a light function layer disposed between the display portion and the encapsulation portion.

The light function layer may be formed of a material selected from the group consisting of Alq3, benzophenone, photo acryl, $BaF_2$, CsF, $Na_5Al_3F_{14}$, KCl, SiO, and combinations thereof.

The thickness of the light function layer may be between about 20 nm and about 200 nm.

At least one of the first encapsulation layer or the second encapsulation layer of the encapsulation portion may have a flat surface at a position corresponding to the display portion.

The encapsulation portion may have a flat surface at a position corresponding to the display portion.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
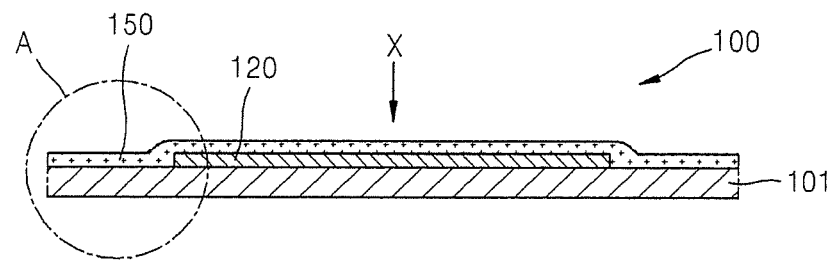
FIG. 1 is a schematic cross-sectional view of an organic light-emitting display apparatus according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a schematic cross-sectional view of an organic light-emitting display apparatus 100 according to an embodiment of the present invention.

Figure 3:
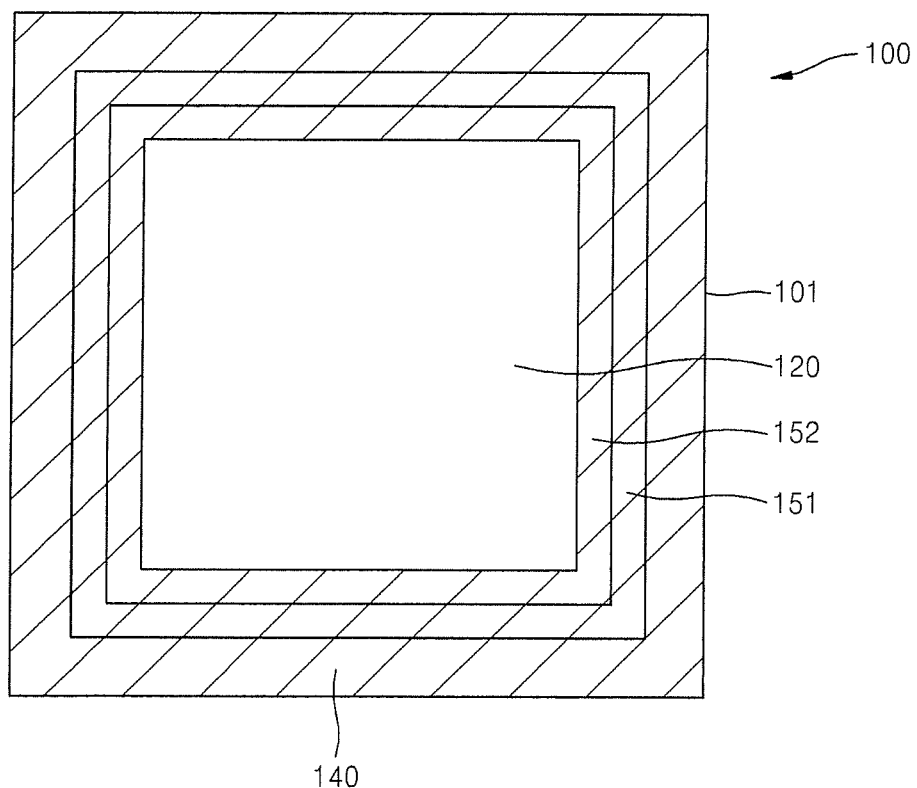
FIG. 3 is a schematic plan view of the organic light-emitting display apparatus shown in FIG. 1 taken from a direction X.

Referring to FIG. 1, a display portion 120, which includes an organic light-emitting device (e.g., an organic light-emitting diode) for forming an image, and an encapsulation portion 150, which encapsulates the display portion 120, are formed on a substrate 101. A region of the substrate 101 excluding the display potion 120 is referenced as a non-display portion 140 and is shown in FIG. 3. The non-display portion 140 may correspond to the edge (or edge portion) of the substrate 101.

Figure 2:
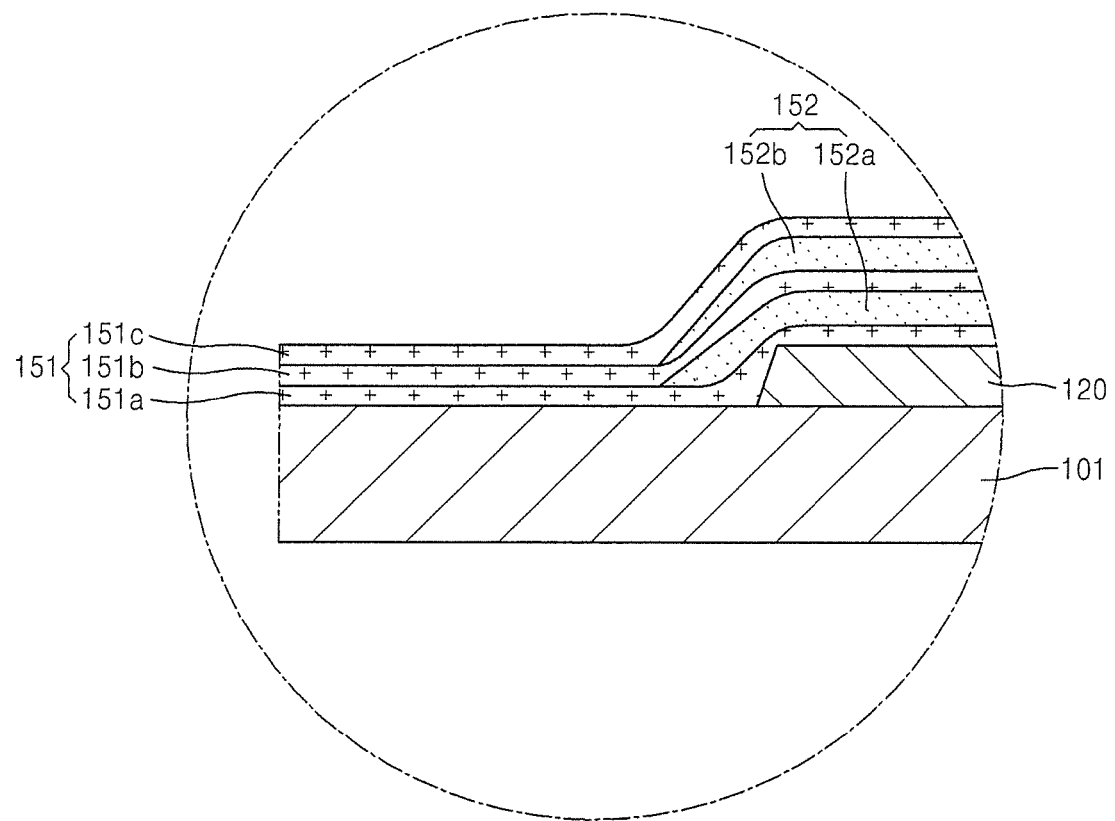
FIG. 2 is a schematic enlarged view of an encapsulation portion of the organic light-emitting display apparatus shown in FIG. 1.

FIG. 2 is a schematic enlarged view of the encapsulation portion 150 of FIG. 1. Here, the encapsulation portion 150 is shown to include a first encapsulation layer 151 composed of three first encapsulation layers 151a, 151b, and 151c and a second encapsulation layer 152 composed of two second encapsulation layers 152a and 152b. In more detail, a first, first encapsulation layer 151a is formed on the display portion 120 and then a first, second encapsulation layer 152a is formed on the first, first encapsulation layer 151a. A second, first encapsulation layer 151b; a second, second encapsulation layer 152b; and a third, first encapsulation layer 151c are sequentially formed on the first, second encapsulation layer 152a. However, the present invention is not limited to the above method of forming the encapsulation layers. For example, as shown in FIG. 6, the second encapsulation layer 152 may be formed on the display portion 120 before the first encapsulation layer 151 is formed on the display portion 120. That is, either the first encapsulation layer 151 or the second encapsulation layer 152 may be the lowest layer of the encapsulation portion 150 that is closest to the display portion 120.

The first encapsulation layer 151 is formed of an inorganic material to block or prevent gas or moisture from penetrating from outside. In more detail, the first encapsulation layer 151 may be formed of a metal nitride and/or oxide containing calcium oxide, alumina, silica, titania, indium oxide, silicon oxide, silicon nitride, and/or aluminum nitride. The second encapsulation layer 152 is formed of an organic material to relieve stress from the inside of the first encapsulation layer 151, fill out any possible defects, such as cracks, pinholes, etc., formed in the surface of the first encapsulation layer 151, and make the encapsulation portion 150 to be overall smooth. The second encapsulation layer 152 may contain acrylic, meta acrylic, polyester, PET, polyethylene, and/or polypropylene.

Although two pairs of the first encapsulation layer 151 and the second encapsulation layer 152 are alternately stacked in FIG. 2, the present invention is not limited thereto. That is, the number of times the first encapsulation layer 151 and the second encapsulation layer 152 are alternately stacked is not limited in the present invention, and two or more pairs of the first encapsulation layer 151 and the second encapsulation layer 152 may be alternately stacked.

An area of the second encapsulation layer 152 is greater than that of the display portion 120, so as to cover the display portion 120. An area of the first encapsulation layer 151 is greater than that of the second encapsulation layer 152, so that the area of the first encapsulation layer 151 is greater than the areas of the display portion 120 and the second encapsulation layer 152.

The first encapsulation layer 151 and the second encapsulation layer 152 are alternately stacked on the upper portion of the display portion 120. Only the first encapsulation layer 151 is stacked on the peripheral region of the display portion 120. As a result, an end portion of the first encapsulation layer 151 contacts the substrate 101, and only the first encapsulation layer 151 is stacked on the outermost circumference of the encapsulation portion 150 on the peripheral region of the display portion 120. Also, the first, first encapsulation layer 151a that is the lowest layer of the encapsulation portion 150 contacts the substrate 101 as shown in FIG. 2.

In general, an organic layer that is more vulnerable to moisture than an inorganic layer is easily deformed and moisture may be transferred therein. Thus, if the second encapsulation layer 152 and the first encapsulation layer 151 are alternately stacked on the peripheral region of the display portion 120 formed on the substrate 101, moisture more easily penetrates into the display portion 120 through the second encapsulation layer 152 than the first encapsulation layer 151. To protect from such penetration, an end region of the encapsulation portion 150 that is the outermost circumference of the substrate 101 does not include the second encapsulation layer 152 on the peripheral region of the display portion 120 in the encapsulation structure of the present embodiment.

Therefore, the organic light-emitting display apparatus 100 effectively prevents a defect caused by contaminates, such as moisture, dust, or gas that may penetrate into the side surface of the display portion 120, in particular, a defect that occurs on the edge of the display portion 120, thereby improving the image quality properties of the organic light-emitting display apparatus 100.

In one embodiment, the thickness of the second encapsulation layer 152 is greater than that of the first encapsulation layer 151. The first encapsulation layer 151 may be formed by using sputtering, chemical vapor deposition (CVD), ion beam assisted deposition (IBAD), etc. The first encapsulation layer 151 that is formed to be too thick may have too many defects that occur and may increase the manufacturing process and cost due to a slow filming operation. Thus, in one embodiment of the present invention, the first encapsulation layer 151 is formed as a thin film (or multiple thin films). Also, the second encapsulation layer 152 containing an organic material is formed by depositing liquefied or gasified monomer and curing the deposited monomer by irradiating UV. Thus, the second encapsulation layer 152 having a greater thickness than the first encapsulation layer 151 can be more easily manufactured than the first encapsulation layer 151, and may have a uniform thickness and elaborate structure.

The second encapsulation layer 152 having a greater thickness than the first encapsulation layer 151 can flatten the encapsulation portion 150 formed on the upper portion of the display portion 120 so that the encapsulation portion 150 has an overall elaborate structure and protects the display portion 120 from contamination of outside air and/or penetration of moisture. Also, on the regions corresponding to the upper and side portions of the display portion 120 shown in FIG. 2, the thickness of the second encapsulation layer 152 is greater than that of the first encapsulation layer 151.

Figure 4:
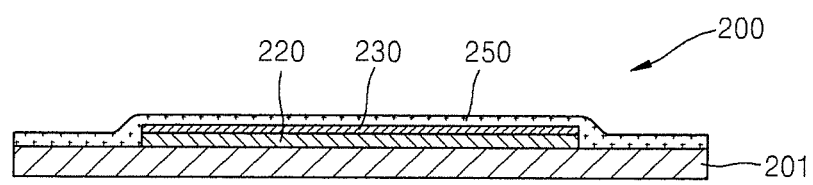
FIG. 4 is a schematic cross-sectional view of an organic light-emitting display apparatus according to another embodiment of the present invention.

FIG. 4 is a schematic cross-sectional view of an organic light-emitting display apparatus 200 according to another embodiment of the present invention. Referring to FIG. 4, a display portion 220 is formed on a substrate 201. An encapsulation portion 250 is formed on the substrate 201 to encapsulate the display portion 220. A light function layer 230 is disposed between the display portion 220 and the encapsulation portion 250. For purposes of convenience of description, differences between the present embodiment and the previous embodiment will now be described. The substrate 201, the display portion 220, and the encapsulation portion 250 are the same (or substantially the same) as described in the previous embodiment and thus their detailed descriptions are not provided again.

Since a second encapsulation layer is formed by depositing liquefied or gasified monomer and curing the deposited monomer by irradiating UV, the light function layer 230 is disposed between the display portion 220 and the encapsulation portion 250, thereby preventing damage to a portion (or a lower portion) of an organic light-emitting device due to the irradiated UV (or protecting this portion of the organic light-emitting device from damage caused by the irradiated UV).

The light function layer 230 is formed of a material that reflects UV and increases a light extraction efficiency of the display portion 220. In more detail, the light function layer 230 is formed of Alq3, benzophenone, photo acryl, $BaF_2$, CsF, $Na_5Al_3F_{14}$, KCl, and/or SiO, and, in particular, may be formed of Alq3.

Although the light function layer 230 is shown as a single layer in the present embodiment, the present invention is not limited thereto. That is, the light function layer 230 may be a multilayer structure. In this regard, if each layer of the light function layer 230 is formed of a material having a different refraction index, the reflection of UV increases. When the light function layer 230 is the multilayer and if the thickness of each layer is ¼ the wavelength of UV, the light function layer 230 increases the reflection of UV. The light function layer 230 resonates light generated by the display portion 220, thereby increasing the light extraction efficiency of the display portion 220. The thickness of the light function layer 230 is between about 20 nm and about 200 nm in order to increase the light extraction efficiency and the color purity of the display portion 220. If the thickness of the light function layer 230 is less than 20 nm, the light function layer 230 may be vulnerable to the penetration of UV, which deteriorates device properties. In one embodiment of the present invention, the thickness of the light function layer 230 is more than 50 nm. Because the light extraction efficiency and the color purity of the display portion 220 may be reduced if the thickness of the light function layer 230 exceeds 200 nm, the thickness of the light function layer 230 is less than 200 nm in another embodiment of the present invention. In one embodiment of the present invention, the thickness of the light function layer 230 is less than 150 nm.

In view of the foregoing and according to an embodiment of the present invention, an organic light-emitting display apparatus can easily encapsulate an organic light-emitting device and improve its electrical properties.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light-emitting display apparatus comprising:
    a substrate;
    a display portion on the substrate and comprising an organic light-emitting device on the substrate;
    a non-display portion being a peripheral region of the organic light-emitting device on the substrate;
    an encapsulation layer on the display portion and comprising at least a first encapsulation layer composed of an inorganic material and at least a second encapsulation layer composed of an organic material, the first and second encapsulation layers being alternately stacked on the display portion; and
    a light function layer directly contacting the display portion, the light function layer being separate from the encapsulation layer and arranged between the display portion and the encapsulation layer, the light function layer for reflecting ultraviolet light and having a thickness of less than 150 nm,
    wherein at least a portion of an end portion of the encapsulation layer which contacts the non-display portion of the substrate, comprises only the first encapsulation layer, wherein the light function layer is a single layer, and wherein the light function layer comprises a material selected from the group consisting of Alq3, benzophenone, photo acryl, $BaF_2$, CsF, $Na_5Al_3F_{14}$, KCl, and combinations thereof.

2. The organic light-emitting display apparatus of claim 1, wherein an area of the second encapsulation layer is greater than that of the display portion.

3. The organic light-emitting display apparatus of claim 1, wherein a thickness of the second encapsulation layer is greater than that of the first encapsulation layer.

4. The organic light-emitting display apparatus of claim 1, wherein an area of the first encapsulation layer is greater than that of the second encapsulation layer.

5. The organic light-emitting display apparatus of claim 1, wherein the first encapsulation layer comprises a lowest layer of the encapsulation portion closest to the display portion.

6. The organic light-emitting display apparatus of claim 1, wherein the second encapsulation layer comprises a lowest layer of the encapsulation portion that is closest to the display portion.

7. The organic light-emitting display apparatus of claim 1, wherein the thickness of the light function layer is from about 20 nm to about 150 nm.

8. The organic light-emitting display apparatus of claim 1, wherein at least one of the first encapsulation layer or the second encapsulation layer of the encapsulation portion has a flat surface at a position corresponding to the display portion.

9. The organic light-emitting display apparatus of claim 1, wherein the encapsulation portion has a flat surface at a position corresponding to the display portion.

10. The organic light-emitting display apparatus of claim 1, wherein the first encapsulation layer comprises a first, first encapsulation layer on the display portion, wherein the second encapsulation layer comprises a first, second encapsulation layer on the first, first encapsulation layer, and wherein the first encapsulation further comprises a second, first encapsulation layer on the first, second encapsulation layer.

11. The organic light-emitting display apparatus of claim 10, wherein the second encapsulation layer further comprises a second, second encapsulation layer on the second, first encapsulation layer, and wherein the first encapsulation layer further comprises a third, first encapsulation layer on the second, second encapsulation layer.

12. The organic light-emitting display apparatus of claim 11, wherein each of the first, first encapsulation layer, the second, first encapsulation layer, and the third, first encapsulation layer is on an outermost perimeter of the substrate.

13. An organic light-emitting display apparatus comprising:

a substrate;

a display portion on the substrate and comprising an organic light-emitting device;

a non-display portion being a peripheral region of the display portion on the substrate;

an encapsulation layer on the display portion and comprising a first, first encapsulation layer on the display portion, a first, second encapsulation layer on the first, first encapsulation layer, and a second, first encapsulation layer on the first, second encapsulation layer; and a light function layer directly contacting the display portion, the light function layer being separate from the encapsulation layer and arranged between the display portion and the encapsulation layer, the light function layer for reflecting ultraviolet light and having a thickness of less than 150 nm, wherein an end portion of the first, first encapsulation layer contacts the substrate and an end portion of the second, first encapsulation layer contacts the end portion of the first, first encapsulation layer, wherein each of the first, first encapsulation layer and the second, first encapsulation layer is composed of an inorganic material and the first, second encapsulation layer is composed of an organic material, wherein the light function layer is a single layer, and wherein the light function layer comprises a material selected from the group consisting of Alq3, benzophenone, photo acryl, BaF2, CsF, NasA13F14, KCl, and combinations thereof.

14. The organic light-emitting display apparatus of claim 13, wherein each of the first, first encapsulation layer and the second, first encapsulation layer is on an outermost perimeter of the substrate.

15. The organic light-emitting display apparatus of claim 13, wherein the thickness of the light function layer is from about 20 nm to about 150 nm.

16. The organic light-emitting display apparatus of claim 1, wherein the light function layer is arranged between the organic light-emitting device and the entire encapsulation layer.

17. The organic light-emitting display apparatus of claim 13, wherein the light function layer is arranged between the organic light-emitting device and the entire encapsulation layer.

* * * * *

UNITED STATES PATENT AND TRADEMARK OFFICE
CERTIFICATE OF CORRECTION

PATENT NO. : 8,552,634 B2
APPLICATION NO. : 12/684560
DATED : October 8, 2013
INVENTOR(S) : So-Yeon Kim et al.

Page 1 of 1

It is certified that error appears in the above-identified patent and that said Letters Patent is hereby corrected as shown below:

In the Claims

Col. 8, Claim 13, line 5   Delete "BaF2, CsF, NasAl3F14,",
Insert -- $BaF_2$, CsF, $Na_5Al_3F_{14}$, --

Signed and Sealed this
Twenty-seventh Day of January, 2015

Michelle K. Lee
*Deputy Director of the United States Patent and Trademark Office*